United States Patent
Pang

(12) 
(10) Patent No.: US 6,177,329 B1
(45) Date of Patent: Jan. 23, 2001

(54) INTEGRATED CIRCUIT STRUCTURES HAVING GAS POCKETS AND METHOD FOR FORMING INTEGRATED CIRCUIT STRUCTURES HAVING GAS POCKETS

(76) Inventor: Kurt Pang, 4407 Peralta Blvd., Fremont, CA (US) 94536

( * ) Notice: Under 35 U.S.C. 154(b), the term of this patent shall be extended for 0 days.

(21) Appl. No.: 09/292,174

(22) Filed: Apr. 15, 1999

(51) Int. Cl.[7] ................................................. H01L 21/76
(52) U.S. Cl. ............................ 438/400; 438/22; 438/109; 438/622
(58) Field of Search ............................. 438/400, 22, 622, 438/118, 109

(56) References Cited

U.S. PATENT DOCUMENTS 5,262,353 * 11/1993 Sun et al. .
5,753,529 * 5/1998 Chang et al. .

* cited by examiner

Primary Examiner—Kevin M. Picardat
Assistant Examiner—D. M Collins
(74) Attorney, Agent, or Firm—Gregory Scott Smith

(57) ABSTRACT

A method for forming gas pockets within integrated circuit devices to provide dielectric isolation between selected conductive structures in the integrated circuit device. The method is useable with many known integrated circuit manufacturing processes wherein the resulting device comprises, preferably, an uppermost layer of intermetal dielectric, on which the method of the present invention may be performed. In general, the method of the invention comprises the following steps. Providing an integrated circuit device structure with a top layer at least partly formed of a segregated conductive material and a solid dielectric material. Forming a mask over the top layer. Forming openings in the mask corresponding to positions where gas pockets are desired in the finished integrated circuit device. Etching through the openings in the mask to form gaps in the dielectric material of the top layer. Depositing a layer of dielectric material over the top layer to close the openings of the gaps formed in the dielectric material to create gas pockets or chambers in desired locations between conductive structures in the integrated circuit device.

13 Claims, 13 Drawing Sheets

$$C_t = C_b + \frac{1}{1/C_s + 1/C_g + 1/C_s}$$

INTEGRATED CIRCUIT STRUCTURES HAVING GAS POCKETS AND METHOD FOR FORMING INTEGRATED CIRCUIT STRUCTURES HAVING GAS POCKETS

FIELD OF THE INVENTION

This invention relates generally to integrated circuits, and more particularly to methods for fabricating integrated circuit structures including gas pockets used to provide dielectric isolation between selected conductive structures, and the integrated circuit structures resulting from the method of the invention.

BACKGROUND OF THE INVENTION

Conventional fabrication of an integrated circuit device involves placing numerous device structures, such as MOFSETs, bipolar transistors, and doped contact regions, on a single monolithic substrate. The device structures are then electrically interconnected with conductive lines or structures so as to implement desired circuit function. The interconnection of the device structures may be done over several stacked levels.

In order to produce ever faster and smaller integrated circuit devices, the integrated circuit industry has continuously increased the density of the device structures on the substrate surface. The increasingly higher device structure density has resulted in a continuous reduction in the separation between conductive structures and layers of materials, a reduction of the width and thickness of conductive lines and an increase the total length of the conductive lines. This has further resulted in a number of adverse effects. For example, by reducing the spacing between conductive materials in the integrated circuit device, an increase in a phenomenon known as parasitic capacitance or capacitive crosstalk is observed, wherein a change in voltage on one conductive structure effect the voltage on nearby conductive structures. The capacitance between two conductive structures can be expressed as $C=k\epsilon_o A/d$, where k is the relative permitivity or the dielectric constant of the material between the two metal structures, $\epsilon_o = 8.85 \times 10^{-12}$ F/m is the absolute permitivity, A is the area of the metal structures, and d is the distance between the metal structures. As the conductive structures of an integrated circuit are packed more closely together, the parasitic capacitance between the conductive structures increases. Also, the electrical resistance increases due to the increase of the total length but the reduction of the cross section area of the conductive lines. The increasing capacitance and resistance degrades the speed and performance of the integrated circuit device. This phenomenon is often referred to as RC delay in the integrated circuit industry.

RC delay can be expressed by the unit of time. (Reference, S. M. Sze, *VLSI Technology*. McGraw-Hill Book Company, 1988.) $RC=R_s L^2 \epsilon/d$, where $R_s$ is the sheet resistance of the conductive lines, L is the length of the conductive line, $\epsilon = k\epsilon_o$ is the permitivity of the dielectric materials between conductive lines, and d is the separating spacing between conductive lines. As can be seen in the equation, when the feature density increases, L becomes longer, and d becomes smaller. This results in increased RC delay. In the early stage of integrated circuit industry, increased density caused a negligible increase in RC delay. However, as the integrated circuit industry moves toward sub-micron technology, the scale of RC delay has become significant. Simply increasing the feature density of the device cannot increase the device speed much.

Two approaches to resolving the RC delay include: (1) using materials with increasingly lower dielectric constant as insulation between conductive structures to reduce the permitivity $\epsilon = k\epsilon_o$, and (2) fabricating the metals forming the conductive structures from materials with increasingly lower resistance to reduce the sheet resistance $R_s$. The use of metals, such as copper, having a lower electrical resistance than the widely used aluminum and aluminum-copper alloys are currently under consideration and development. However, the use of lower resistance metals will not completely resolve the RC delay phenomenon, particularly the parasitic capacitance problem, as the conductive structures become inevitably more closely packed.

Using lower dielectric constant materials is more effect than using better conductive materials alone. For example, sheet resistance is directly related to the electrical resistivity of the conductive material used. The resistivity of aluminum, which is conventionally used as the conductive material for integrated circuit device, is $2.8 \times 10^{-8}$ ohm·m. The resistivity of copper is $1.7 \times 10^{-8}$ ohm·m. Therefore, by replacing the aluminum with copper, the RC delay can be reduced by $(2.8-1.7)*100\%/2.8=39\%$. Even if aluminum is replaced by the best conductive material, silver, which has the resistivity of $1.6 \times 10^{-8}$ ohm·m, the RC delay can be reduced by only 43%. On the other hand, the relative permitivity of $SiO_2$, the currently widely used dielectric material, is about 4. The physical minimum relative permitivity is 1. Therefore, theoretically, the RC delay can be reduced by $(4-1)*100\%/4=75\%$ by using a vacuum gap. If a dielectric material with a relative permitivity value of 2 is used, the RC delay is reduced by 50%, which is still better than the approach of reducing sheet resistance. However, it is preferred to use a combination of both dielectrics with low permitivity and conductors with low resistivity.

Accordingly, the use of dielectric materials having a lower dielectric value than the widely used $SiO_2$ and doped silicon oxides are currently under consideration and development. Current dielectric materials have a k value approximately between 3.9 and 4.3. New low-k dielectric materials under consideration, such as TEFLON and organic dielectrics, may be able to achieve k values as low as 2. However, the use of many kinds of low-k dielectric materials is not feasible due to the fact that the chemical and physical properties of many low-k dielectric materials are difficult to make compatible with, or integrate into, the conventional integrated circuit fabricating processes.

The minimum theoretical dielectric constant value is 1.0 for a total vacuum. However, it is well known that air has a dielectric constant of 1.0005, which approaches the minimum theoretically physically possible value of dielectric constant. A number of approaches have been suggested for using air pockets formed within an integrated circuit device between closely spaced conductive structures both on the same level and between on different levels. However, previous efforts have suffered from a number of problems including, but not limited to, (1) process steps that are incompatible with the industry preferred processes such as damascene processes when copper will be used as conductive materials, (2) lack of sufficient control of the size and location of the air pockets, (3) the formation of open voids, (4) formation of gas pockets too close to conductive structures that are liable to filling by conductive material, (5) integrated circuit devices that are mechanically fragile or brittle, (6) the inability to stack multiple layers due to the fragility of underlying layers, (7) a significantly reduced ability of integrated circuit device to dissipate heat, and (8) direct exposure of the conductive structures to air which may result in undesirable chemical changes in the nature of conductive structures.

In order to reduce the RC delay for the conductive features or structures with small separation spacing, a new dielectric isolation scheme is required. What is needed is a process for forming air pockets to provide dielectric isolation in integrated circuit devices that avoids the difficulties encountered in prior efforts. In particular, what is needed is a process that is compatible with preferred fabrication processes for making integrated circuit devices, including but not limited to, various damascene processes, and which will not generally result in (a) the formation of open voids, (b) the formation of air pockets that are vulnerable to being filled with metallic materials in subsequent processes steps, (c) a significant decrease in the mechanical strength of the integrated circuit devices, or (d) a significant reduction in the heat dissipation capacity of the device.

SUMMARY OF THE INVENTION

Accordingly, the present invention provides a process for forming air gaps or gas pockets within integrated circuit devices to provide dielectric isolation between selected conductive structures or structures in the integrated circuit device. The method of the invention may be used with many known integrated circuit manufacturing processes including, but not limited to, current conventional fabrication processes, damascene processes, and dual damascene processes. In fact, the method of the invention can be used following virtually any integrated circuit process step. However, it is preferable that the method of the invention follow a step wherein the resulting device comprises an uppermost layer comprised of segregated regions of conductive materials and dielectric materials, for example as seen in FIG. 8 and FIG. 21 which illustrate examples of a partially constructed integrated circuit devices having a number of layers including one or more uppermost intermetal dielectric layers, on which the method of the present invention may be performed.

In general, the method of the invention comprises the following steps. Providing an integrated circuit device structure with a top layer at least partly formed of substantially segregated conductive materials and solid dielectric materials to form conductive structures within one or more layers. Forming a mask over the top layer. Forming openings in the mask corresponding to positions where gas pockets are desired in the finished integrated circuit device. Etching through the openings in the mask to form gaps, preferably in the dielectric materials of the top layer or layers. Depositing a layer of dielectric material over the top layer to close the openings of the gaps formed in the dielectric material to create gas pockets or chambers in the desired locations between conductive structures in the integrated circuit device.

The invention also includes the integrated circuit structure including gas pockets formed and dimensioned according to the method of the invention.

BRIEF DESCRIPTION OF THE DRAWINGS

FIG. 2 is a cross section view of the integrated circuit device of FIG. 1 with a first dielectric layer deposited thereon.

FIG. 3 is a cross section view of the integrated circuit device of FIG. 2 after a photo resist layer has been deposited on top of the dielectric layer.

FIG. 4 is a cross section view of the integrated circuit device of FIG. 3 after the photo resist has been processed to form openings through which the dielectric material will be etched.

FIG. 5 is a cross section view of the integrated circuit device of FIG. 4 after the dielectric material has been etched to form patterns for conductive lines.

FIG. 6 is a cross section view of the integrated circuit device of FIG. 5 after the photo resist has been removed.

FIG. 7 is a cross section view of the integrated circuit device of FIG. 6 after the conductive materials has been deposited over the surface thereof.

FIG. 8 is a cross section view of the integrated circuit device of FIG. 7 after the excess conductive material has been removed.

FIG. 9 is a cross section view of the integrated circuit device of FIG. 8 after a photo resist layer has been deposited over the surface thereof.

FIG. 10 is a cross section view of the integrated circuit device of FIG. 9 after the photo resist layer has been processed to form openings through which the underlying dielectric material will be etched.

FIG. 11 is a cross section view of the integrated circuit device of FIG. 10 after the underlying dielectric material has been etched to form gaps.

FIG. 15 is a cross section view of the integrated circuit device of FIG. 13 after a deposition of an etch stop layer.

FIG. 16 is a cross section view of the integrated circuit device of FIG. 15 after the etch stop layer has been etched to make openings for later etching of gaps to received conductive material to form vias.

FIG. 17 is a cross section view of the integrated circuit device of FIG. 16 after the deposition of a third dielectric layer.

FIG. 18 is a cross section view of the integrated circuit device of FIG. 17 after a photo resist layer has been deposited over the surface thereof, and processed to form openings through which the underlying second and third dielectric layer will be etched to receive conductive materials forming vias in the second dielectric layer and the conductive lines in the third dielectric layer.

FIG. 19 is a cross section view of the integrated circuit device of FIG. 18 after the second and third dielectric layers have been etched and the photo resist has been removed.

FIG. 20 is a cross section view of the integrated circuit device of FIG. 19 after the deposition of a layer of conductive material.

FIG. 21 is a cross section view of the integrated circuit device of FIG. 20 after the excess conductive material has been removed.

FIG. 22 is a cross section view of the integrated circuit device of FIG. 21 after a photo resist layer has been deposited over the surface thereof, and processed to form openings through which the underlying second and third layers of dielectric material will be etched.

FIG. 23 is a cross section view of the integrated circuit device of FIG. 22 after the underlying second and third layers of dielectric material have been etched to form gaps.

FIG.24 is a cross section view of the integrated circuit device of FIG. 23 after the photo resist layer has been removed.

FIG. 25 is a cross section view of the integrated circuit device of FIG. 24 after a fourth dielectric layer has been deposited over he surface thereof, forming gas pocket structures within the integrated circuit device.

DETAILED DESCRIPTION OF THE INVENTION

The present invention provides a process for forming air gaps within integrated circuit devices to provide dielectric isolation between selected conductive structures in the integrated circuit device and the integrated circuit device resulting therefrom. The term "air" is intended to include any material or element in a gaseous state. The process steps of the invention are intended to be used with other known integrated circuit manufacturing processes, and the method of the invention can be used following virtually any integrated circuit process step, but preferably following a step wherein the resulting device comprises an uppermost layer of conductive metal and dielectric, including but not limited to integrated circuit structures such as in FIGS. 8 and 20. The book "Silicon Processing for the VLSI Era" by S. Wolf, published by Lattice Press, 1995, describes in detail a variety of semiconductor manufacturing processes that may be relevant to the manufacture of devices also using the method of the present invention, and is hereby incorporated by reference. For purposes of explanation, the method of the invention will be described below as additional steps in a damascene process and in a dual damascene process.

Figure 1:
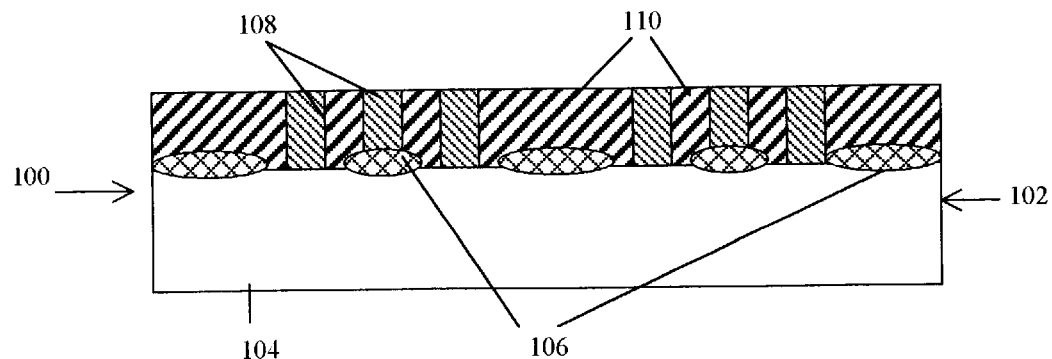
FIG. 1 is a cross section view of a generic foundation or base for an integrated circuit including a substrate on which a number of devices have been formed, and over which an insulating layer has been deposited having conductive vertical interconnects or plugs.

FIGS. 1–13 will generally show an example of an integrated circuit device, referenced by the number 100, fabricated in a process that includes the method steps of the invention. FIG. 1 shows a generic or typical foundation or base for an integrated circuit device, generally referenced by the number 102. The base 102 is exemplary only, and other configurations may be used in the method of the invention. As is well known in the art, the base 102 typically includes a substrate 104 with a multiplicity of device structures 106 formed upon the surface of the substrate 104, such as MOFSETs, bipolar transistors, and doped contact regions. The substrate 104 is preferably formed of silicon, which is typically single crystalline. However, the substrate 104 could be made of any other acceptable materials including, but not limited to, gallium arsenide, silicon on sapphire (SOS), epitaxial formation, germanium, germanium silicon, diamond, silicon on insulator (SOI) material, selective implantation of oxygen (SIMOX) substrates, and or like substrate materials.

Typically, a dielectric insulating, usually called inter-level dielectric (ILD), layer 110 is deposited over the substrate 104 and device structures 106, and includes plugs 108 filled with conductors connected to the device structures 106 deposited on the substrate 104. Any desired dielectric material may be used, including but not limited to, silicon dioxide ($SiO_2$), Parlyene-N, HSQ, flourinated silicate glass (FSG), borophosphosilicate glass (BPSG), oxide-nitride-oxide (ONO), tantalum pentoxide ($Ta_2O_3$), silicon nitride, titanium oxide, oxynitride, germanium oxide, a spun on glass (SOG), a spun on polymer (SOP), any chemical vapor deposited dielectric, a grown oxide, and/or other like dielectric materials.

Figure 2:
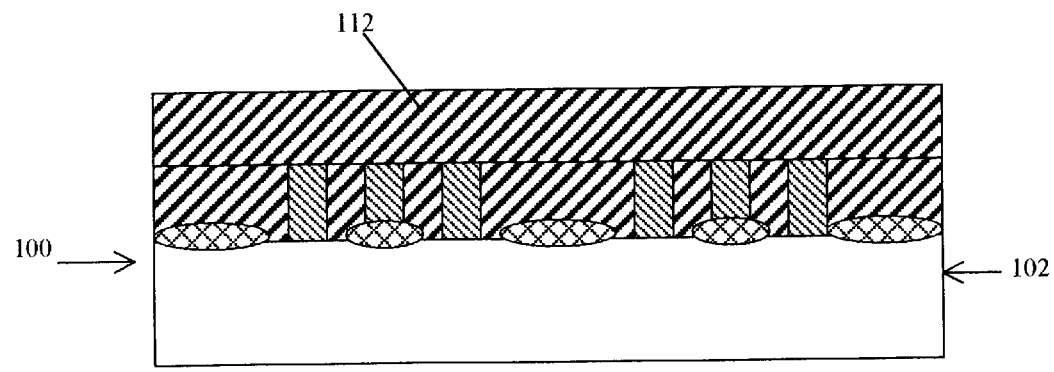
FIGS. 2–11 illustrate sequential steps of the method of the invention used in a damascene process beginning with the structure shown in FIG. 1, where.

Referring to FIG. 2, in a damascene process the first step includes depositing a first layer of dielectric material 112 onto the upper surface of the base 102, as shown in FIG. 2. Any desired dielectric material may be used, and the particular dielectric material used is not critical to the invention, although a low k dielectric material is preferred. Current acceptable dielectric materials include, but not limited to, those listed in the previous paragraph. The method of applying the first layer of dielectric material is also not critical to the invention, and examples of acceptable methods for depositing the dielectric material 112 include known chemical vapor deposition (CVD) methods, physical vapor deposition (PVD) methods, and spin-on deposition methods.

Figure 3:
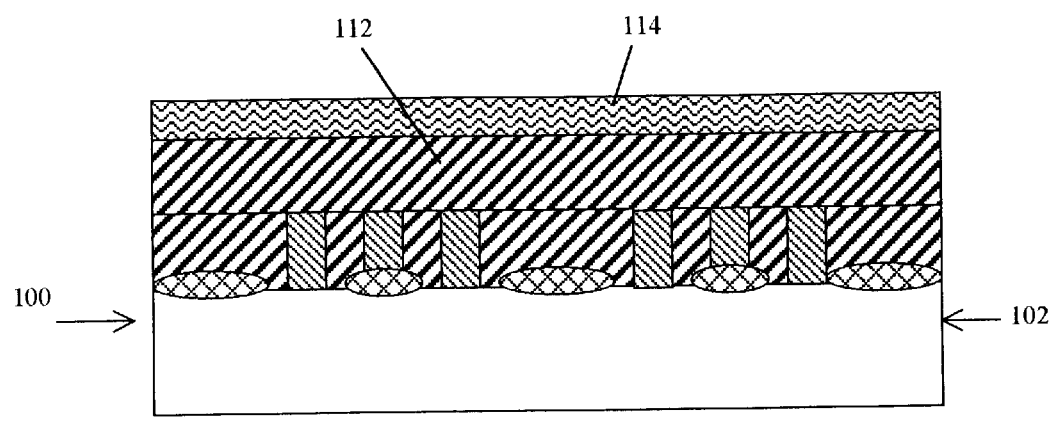

Next, a layer of photo resist 114 is formed over the dielectric material 112, as shown in FIG. 3. Conventional spin-on methods are preferred for forming the photo resist layer, however, other methods of applying the photo resist may be acceptable. To enhance the photo-lithographic process, anti-reflective coatings (ARC) may be deposited prior to the photo resist. The photo resist is cured in a conventional manner that depends on the particular photo resist material chosen.

Figure 4:
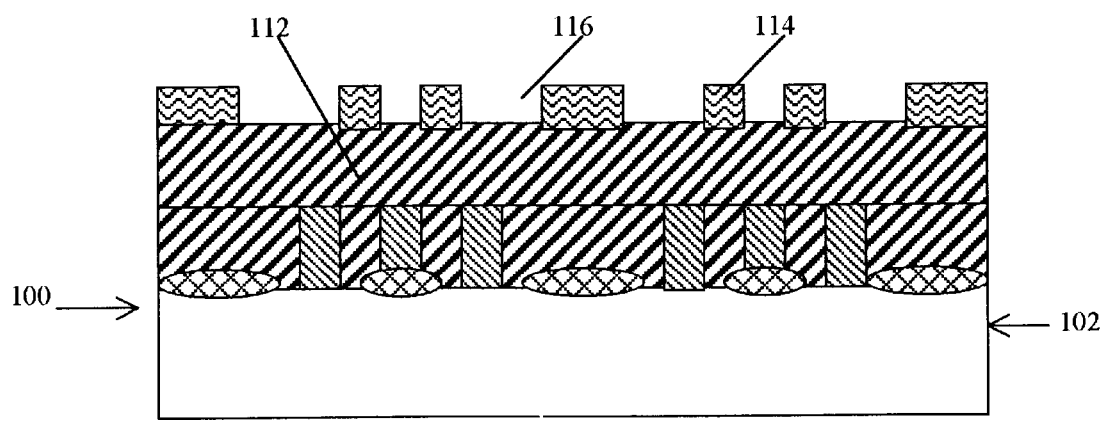

Referring to FIG. 4, the photo resist is exposed through a mask to an agent such as UV light, electron beam, or X-rays. The photo resist is developed to produce regions 116 where the photo resist has been removed to allow etching materials access to the underlying dielectric layer.

Figure 5:
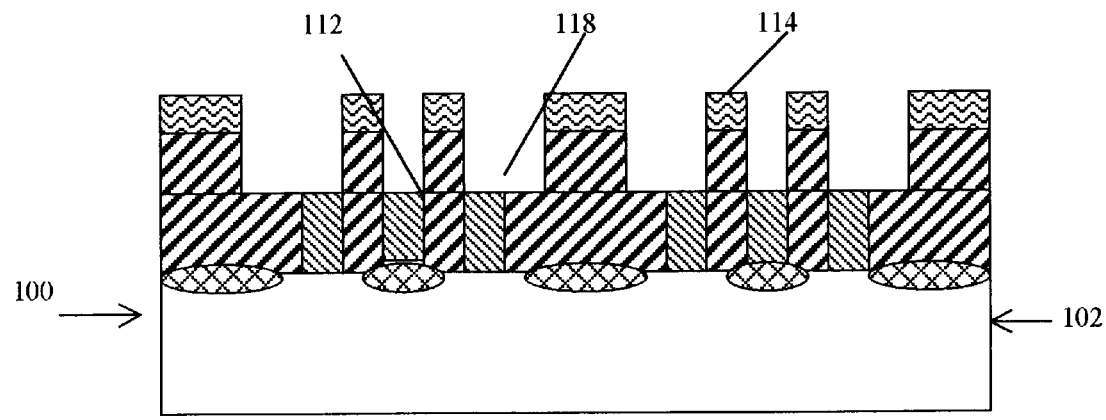

Referring to FIG. 5, the dielectric material 112 underlying the photo resist 114 is etched through the gaps. This results in the patterns or gaps 118 to receive conductive material that will form conductive lines or circuits. The particular etching method is not critical to the invention, however, conventional reactive ion etching (RIE) or microwave electron cyclotron resonance (ECR) plasma etching is currently preferred.

Figure 6:
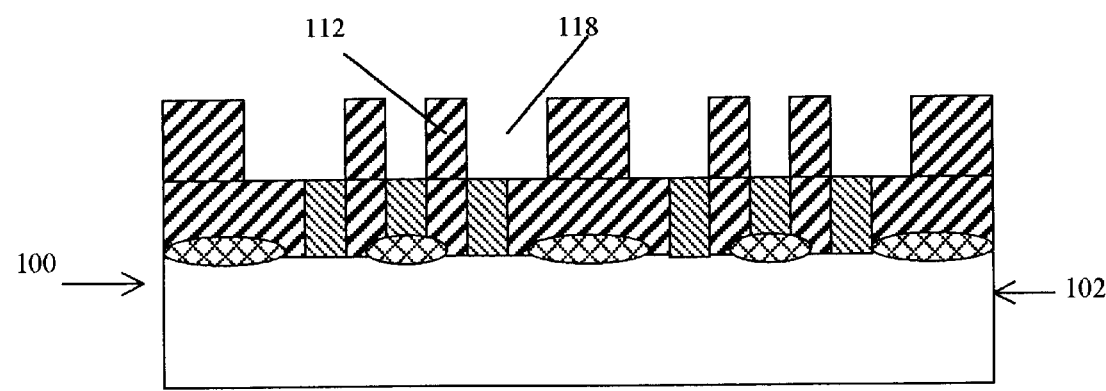

After etching, the photo resist is ashed using a conventional photo resist ashing method to remove any remaining photo resist material. What remains is a dielectric layer 112 with gaps 118 to receive a conductive materials, as shown in FIG. 6, which shows gaps 118 formed in the dielectric material 112.

Figure 7:
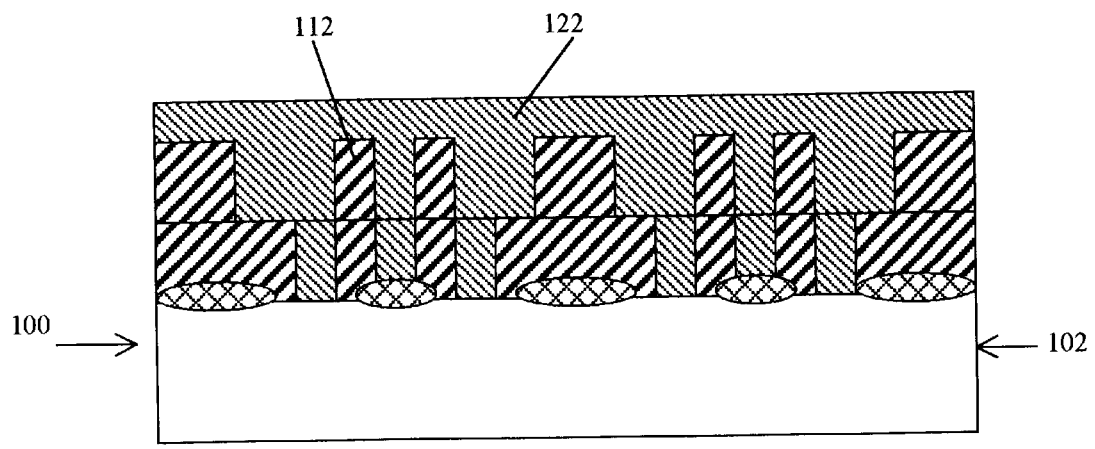

Referring to FIG. 7, conductive material 122 is deposited in a layer over the surface of the dielectric material 112, and within the gaps 118 created in the dielectric material 112 in the previous steps. Any known method for depositing the conductive material 122 may be used, including, but not limited to, CVD, PVD, and electroplating. Any practical materials may be used for conductive material 122, including but not limited to, copper, aluminum, polysilicon, tungsten, silver, gold, and various alloys of the preceding. It is typical to use a multilayer deposition and wiring structure. For example, it may be desirable to include a thin barrier layer, comprised of such materials as $TiN_x$, $WN_x$, or $TaN_x$, and a thin "glue" or adhesion layer, comprised of such materials as tungsten or titanium, on the inner surfaces of the gaps 120 in the dielectric material 112 to enhance the deposition of subsequent conductive material 122 and the performance of the circuits. However, for simplicity, a single layer of conductive material 122 is shown in FIG. 7. The materials chosen for conductive material 122, and the method of applying the material, are not critical to the invention.

Figure 8:
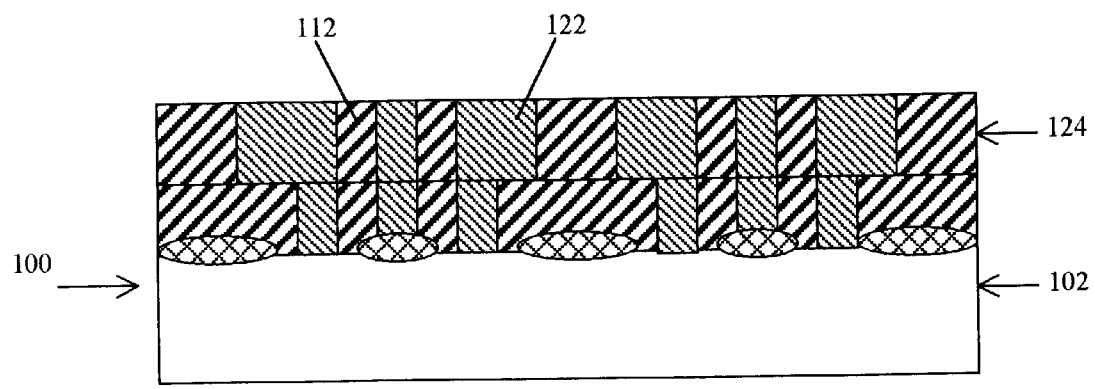

Excess conductive material 122 remaining above the dielectric material 112 is removed. Any desired method for doing so may be used, including current conventional CMP and etch back techniques. CMP is preferred because it results in a planarized surface for deposition of the next dielectric layer. The result of this step is shown in FIG. 8. The conductive material 122 all now lies within the dielectric material 112, with conductive lines 122 being defined by the dielectric material 112. The conductive material 122 and dielectric material 112 together form level 1 interconnect layer 124.

The conventional process, or non damascene process, may be used to achieve the same resulting structure seen in FIG. 8. Due to the characteristics of aluminum process, the conventional process starting from FIG. 1 is different from the damascene process described in the steps shown in FIGS. 2 to 8. In exemplary conventional process, the conductive material is deposited on the substrate 102. A photo resist layer is deposited on the conductive material layer. The photo resist is then exposed through a mask to an agent such as UV light, electron beam, or X-rays. The photo resist is developed to produce regions where the photo resist has been removed to allow etching materials access to the underlying conductive layer. RIE plasma etching or wet chemical etching is conventionally used to etch the conductive layer so that the pattern of conductive lines is formed. Then the photo resist is removed by conventional ashing methods. Dielectric material is deposited to fill the gaps between the conductive lines. A good gap filling dielectric process must be used to ensure there is no open voids. Currently, TEOS/Ozone atmospheric pressure CVD (APCVD), TEOS/Ozone sub-atmospheric pressure CVD (SACVD), or high-density plasma CVD (HDPCVD) is commonly used to fill the gaps smaller than 0.5 microns. The excessive dielectric materials above the conductive lines may be removed by CMP or etch back techniques. This results in the same structure as shown in FIG. 8.

Figure 9:
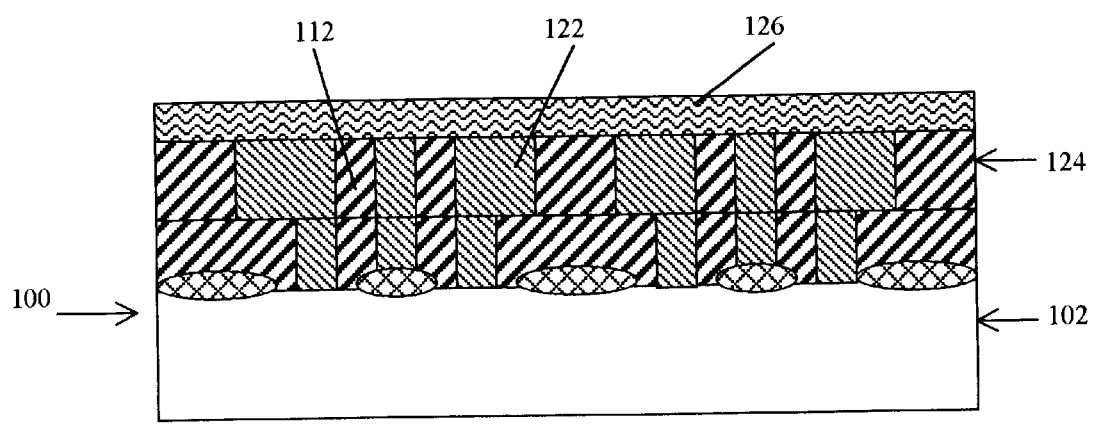
Figure 10:
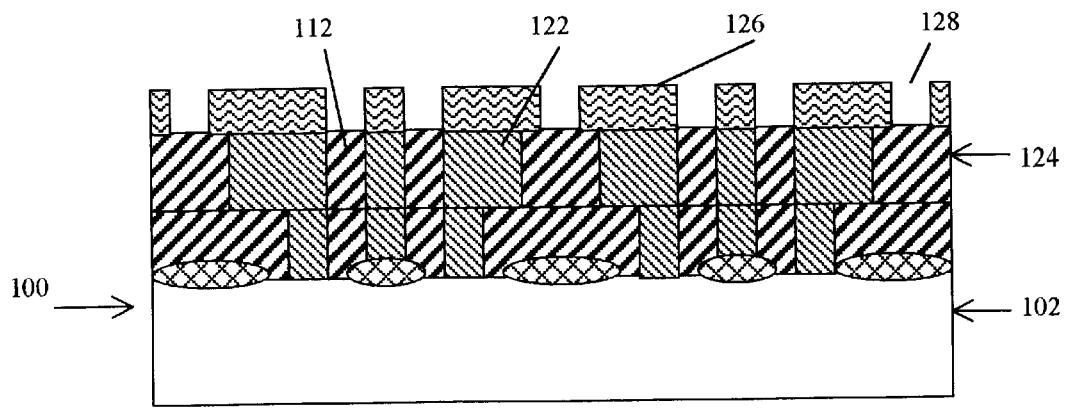
Figure 11:
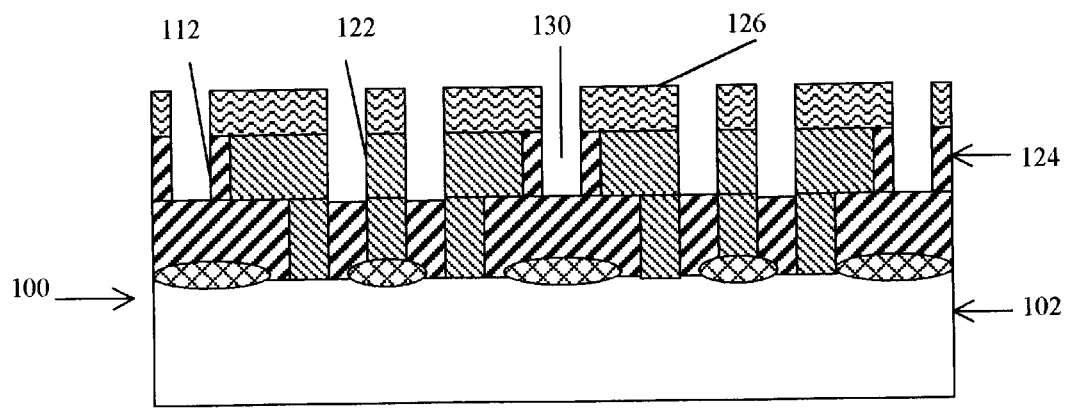

The next several steps comprise the method of the invention for forming gaps or air pockets between conductive elements or structures in an integrated circuit device. A layer of photo resist 126 is formed over the level 1 interconnect layer 124 as seen in FIG. 9. The use of a conventional spin-on method is preferred for forming the photo resist layer 126, however, other methods of applying the photo resist may be acceptable. To enhance the photo-lithographic process, anti-reflective coatings (ARC) may be deposited prior to the photo resist. The photo resist layer 126 is cured in a conventional manner that depends on the particular photo resist material chosen. The photo resist layer 126 is then exposed through a mask to an agent such as UV light, electron beam, or X-rays, and the photo resist layer 126 is then developed to produce regions where portions of the photo resist layer 126 have been removed to form etch mask gaps 128 to allow etching materials access to the underlying level 1 interconnect layer 124, as seen in FIG. 10. The resulting etch mask preferably covers all of the conductive lines 122, and also preferably extends horizontally somewhat beyond the underlying conductive lines 122, in order to prevent damage to the conductive lines 122 during the etching process.

An etching agent selected to effectively etch portions of the dielectric material 112 is then applied to etch selected portions of the dielectric material 112 exposed by the etch mask gaps 128, to create level 1 interconnect layer gaps 130. The particular method used to etch the underlying dielectric material 112 through the etch mask gaps 128 in the photo resist layer 126 is not critical to the invention, however, conventional RIE or ECR plasma etching is currently preferred, to produce the resulting structure seen in FIG. 11. Although FIG. 11 only shows that the gaps 130 are within the dielectric layer 124, it is preferred that the etching process extends the gaps into the ILD layer 110. This can reduce the capacitance of the ILD layer by forming the air gaps in the steps described below.

Figure 12:
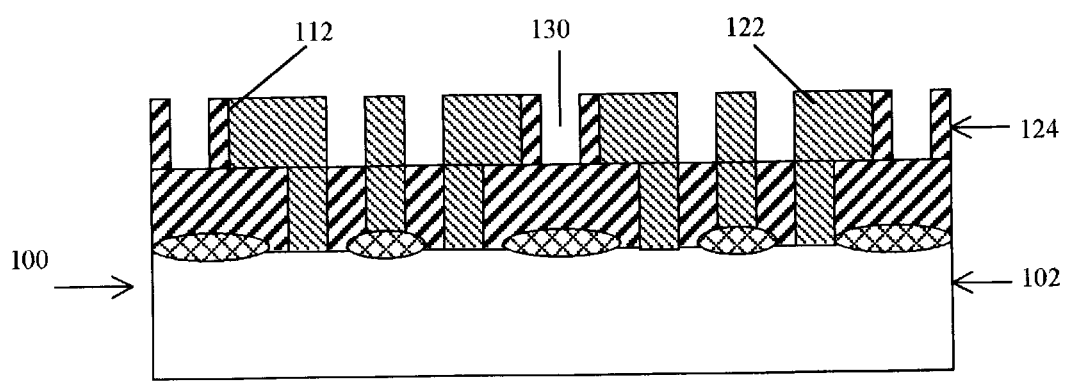
FIG. 12 is a cross section view of the integrated circuit device of FIG. 11 after photo resist layer has been removed.
Figure 13:
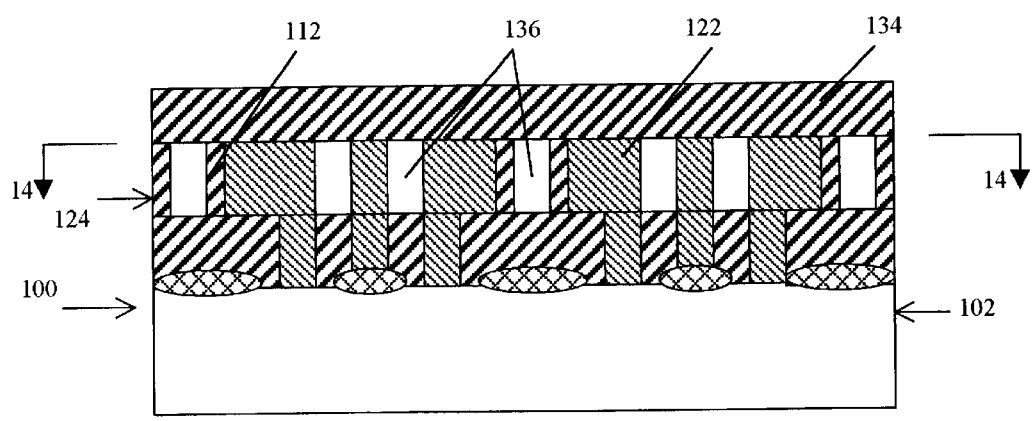
FIG. 13 is a cross section view of the integrated circuit device of FIG. 12 after a second dielectric layer has been deposited over the surface thereof, forming gas pocket structures within the device.

After etching, the photo resist layer 126 is ashed using a conventional photo resist ashing method to remove any remaining photo resist material. The resulting structure is seen in FIG. 12, showing the photo resist layer 126 removed, and narrow gaps 130 formed in the level 1 interconnect layer 124 in desired locations between the conductive lines 122. A second layer of dielectric material 134 is then deposited over the surface of the level 1 interconnect layer 122, and over the gaps 130, creating air pockets, hereafter referenced as air pockets 136, as shown in FIG. 13. It is important that the second layer of dielectric material not completely fill the gaps 130.

The steps seen and described in association with FIGS. 9 to 13 may be repeated as necessary to form multiple layers of dielectric with interconnect and or conductive lines and insulating air pockets. The steps seen and described in association with FIGS. 2 to 13 may be started from any layer of the integrated circuit device, and may be repeated as necessary to form multiple layers with air pockets.

Figure 14:
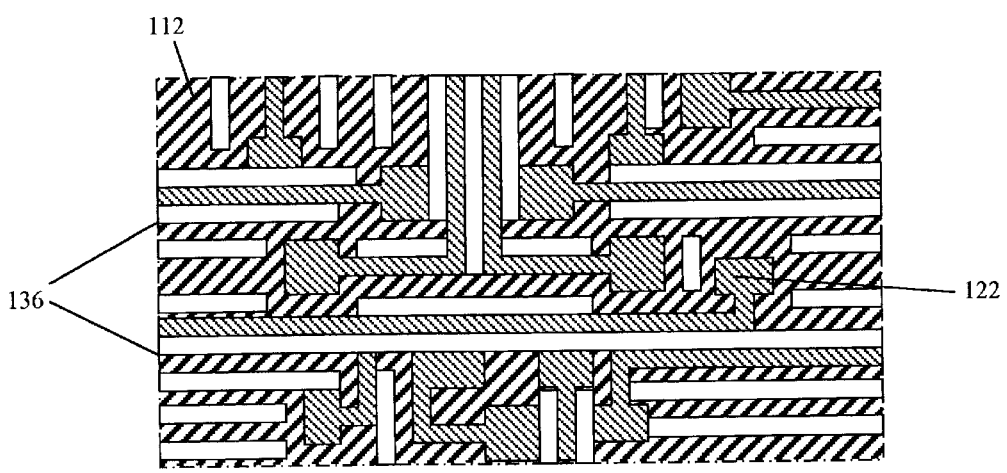
FIG. 14 is a cross section view of the device of FIG. 13 taken along lines 14—14, showing a top view of the device of FIG. 13.

The invention also includes the integrated circuit structure including gas pockets formed and dimensioned according to the method of the invention. FIG. 14 is a top cross section view of the integrated circuit device 100 of FIG. 13 taken along lines 14—14 formed using the method of the invention. Air pockets 136 can be seen positioned between many conductive elements providing lower parasitic capacitance than would be achieved using current solid dielectric materials alone.

One of the advantages of the method of the invention described above over prior art methods is that the size of the gaps created in the dielectric material are very controllable, which allows the creation of gaps sized to prevent significant quantities of solid dielectrics from entering the gaps when the air pockets are created. For example, it has been observed that gaps with a maximum opening less than or equal to 0.5 micron in width, with an aspect ratio of height/width greater than or equal to 0.7, and of any length, will not be completely filled by $SiO_2$ using the conventional plasma enhanced CVD process. (Reference: Fleming etc., "Lowering of Intralevel Capacitance Using Air Gap Structure", *Conference Proceedings USLI XII,* 1997, Materials Research Society, Pages 471–477.) Thus, it is preferred that the maximum width of the openings of the gaps 132 at the surface of the level 1 interconnect layer 124 be less than or equal to 0.5 micron in width, and the aspect ratio equal or greater than 0.7. However, the method of the invention comprehends that the maximum allowable width of the gaps 132 may be adjusted up or down depending on the particular dielectric materials, deposition method, and the deposition conditions used.

A second advantage of the method of the invention described above over prior art methods is that the locations of the gaps created in the dielectric material are very controllable. A serious concern of air pockets in the prior art methods is that some air pockets are close to the vias that will be formed in the subsequent processes. If there is a misalignment during the via etch steps, metal will fill into the air pockets in the prior arts methods. With the method of the invention described above, the locations of the air pockets is controllable to prevent the formation of air pockets to close to the vias.

A third advantage of the method of the invention is that it eliminates the corner effect. Normally, the conductive structures of an integrated circuit are not simple parallel patterns. The spacing between conductive structures usually has right angle corners. Also, the spacing between conductive structures in the same level of metal of an integrated circuit usually varies within a large range (from sub-microns to a few tens of microns). Thus, open voids may be formed in the prior art methods. Whereas, in the method of the invention, the air pockets can be controlled as straight lines, as showed in FIG. 14, or cylindrical air pockets. Therefore, no open void is formed and corner effect may be eliminated.

The method of the invention is equally useable in a dual damascene process. A number of dual damascene process methods are known. FIGS. 15 to 24 show one exemplary dual damascene process into which the method of the invention may be incorporated. However, as previously stated the method of the invention can be used in almost any integrated circuit fabrication process, but preferably following a step wherein an intermediate structure comprises an uppermost lever interconnect layer such as shown in FIG. 8 or as will be seen in FIG. 20.

Figure 15:
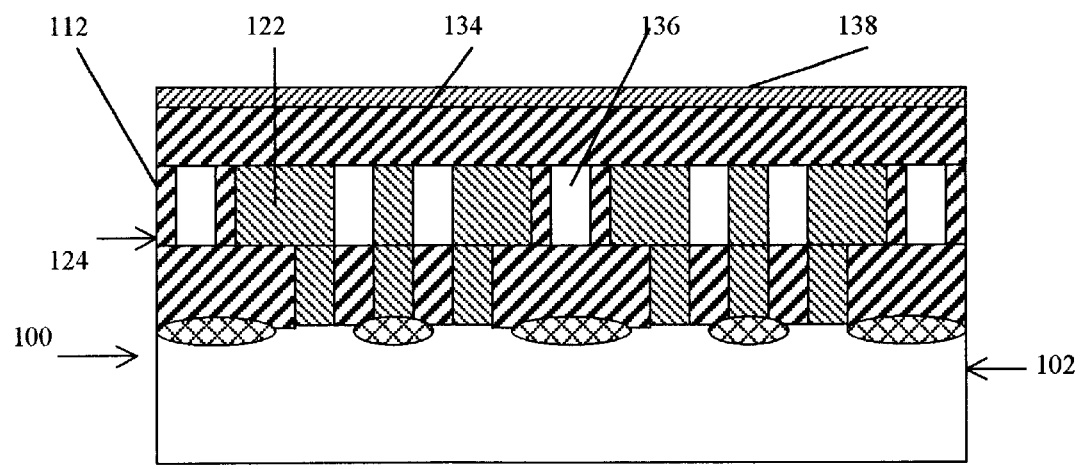
FIGS. 15–25 illustrate sequential steps of the method of the invention used in a dual damascene process beginning with the device of FIG. 13 where.
Figure 16:
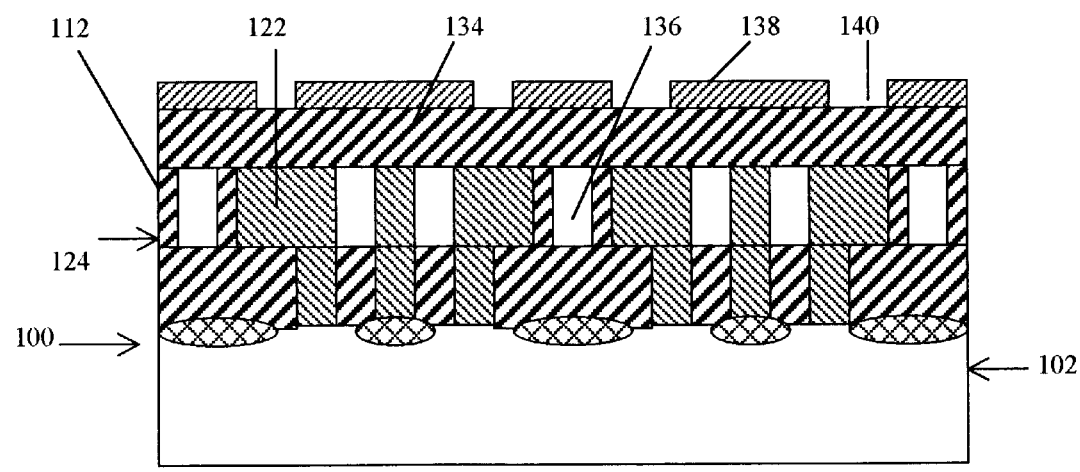

FIG. 15 shows an etch stop layer 138 being applied over the surface of the second dielectric material layer 134. It is preferred that the material chosen for the etch stop layer 138 be different from the material used in the second layer of dielectric material 134, and also from the third layer of dielectric material that will subsequently be formed over the top of the etch stop layer 138. Typically, the second layer of dielectric material 130 and the third layer of dielectric material are both silicon oxides. Thus an appropriate choice for the etch stop layer 138 is silicon nitride. Silicon nitride is chemically sufficiently different from silicon oxides to be effective as an etch stop. The etch stop layer 138 is preferably thin, 200 to 1500 angstrom, in order to minimize the effect of the etch stop layer 138 on the topography of the device in later process steps, yet thick enough to serve as an effective mask to the etching of the second layer of dielectric material 134.

The etch stop layer 132 is then patterned to provide openings corresponding to the desired position of the vertical interconnects or vias that will be formed in the second layer of dielectric material 134 linking conductive lines 122 in level 1 interconnect layer 124 with conductive elements in the level 2, yet to be formed, interconnect layer above the etch stop layer 138. Similar to the photo lithographic described above, a photo resist is formed over the etch stop layer 138, cured, exposed through a mask to a light source, and developed. The photo resist becomes a mask which provides opening 140 for the formation of vias. The etch stop layer 138 is etched by an etching process chosen to selectively etch the silicon nitride of the etch stop layer 138, to expose the second layer of dielectric material 134 without etching the second layer of dielectric material 134. In order to minimize the impact of the openings 140 on the topography of subsequent steps, it is preferred that no depression is formed in the second layer of dielectric material 134 by the etching process which forms openings 140 in the etch stop layer 138. Any known etch methods may be used. For example, a known process involves the use of etchants derived from $SF_6$ and $C_2F_6$ mixed with quantities of other gasses such as HBr and He, and adjusted within known parameters may be used to selectively etch silicon oxides or silicon nitrides. The photo resist is then removed by any known ashing method resulting in the structure seen in FIG. 16.

Figure 17:
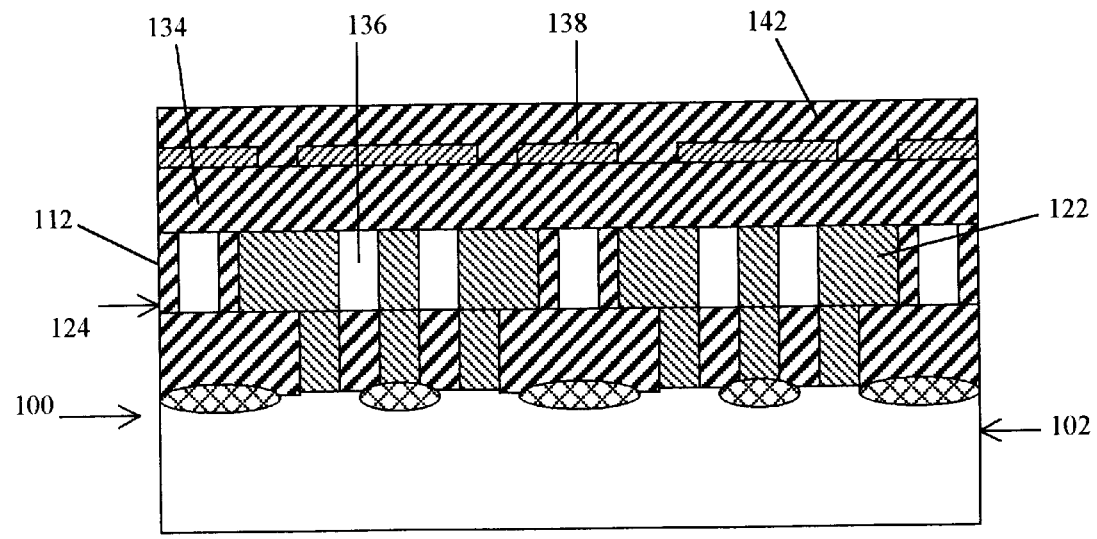

Referring to FIG. 17, a third layer of dielectric material 142 is formed over the surface of the etch stop layer 138. The third layer of dielectric material 142 is preferably an oxide identical to the second layer of dielectric material 134, however, other dielectric materials could be used. The third layer of dielectric material 142 may be deposited using known CVD methods, for example using a TEOS precursor or $SiH_4$ source gas, or alternatively any known spin on dielectric, or PVD methods. The thickness depends on the desired height of the conductive metal lines that will be created.

Figure 18:
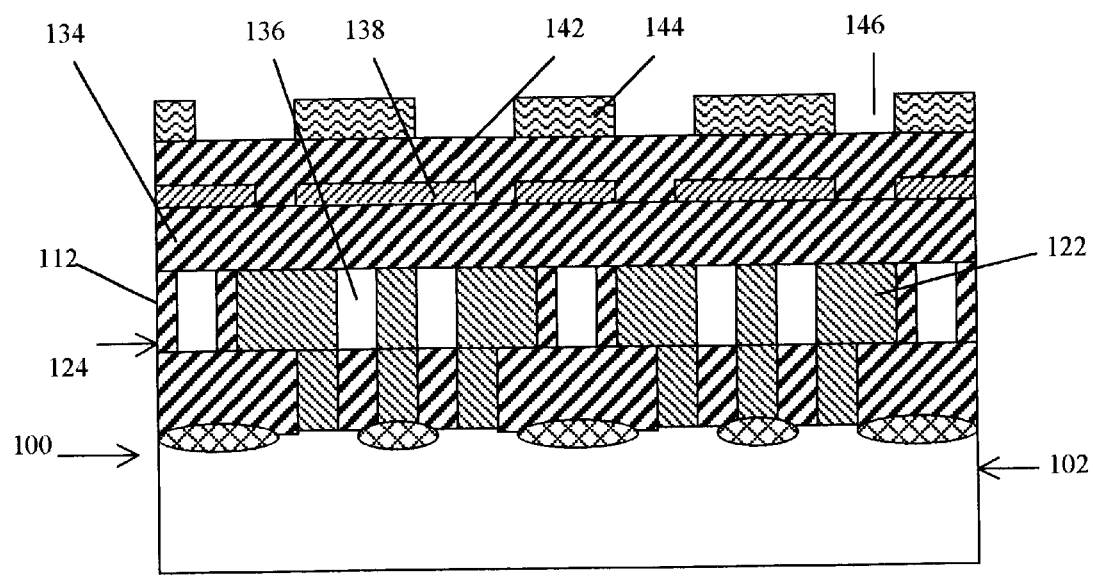
Figure 19:
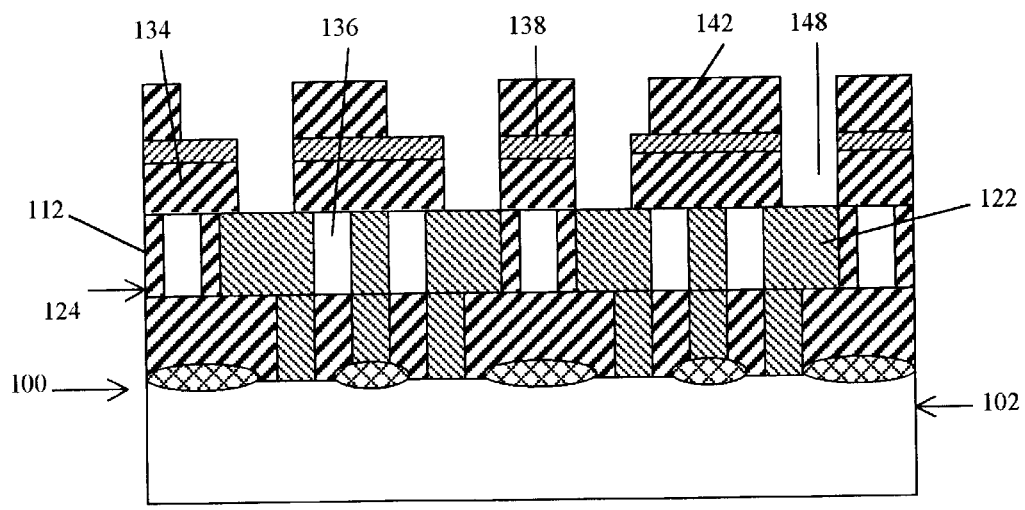

A photo resist mask 144 is formed on the surface of the third layer of dielectric material 142 using any known process, such as the photo resist processes previously described. The openings 146 created on the photo resist 144 will have a pattern corresponding to the pattern of the conductive lines to be formed in the third layer of dielectric material 142, as shown in FIG. 18. Some of the openings 146 formed in the mask 144 are also over the opening in the etch stop layer 138. In a single etch step, the third layer of dielectric material 142 is etched to produce gaps to receive conductive material to form conductive lines, and the second layer of dielectric material 134 is etch to form gaps to receive conductive material to form vias between the conductive lines 122 on the level 1 interconnect layer 124 and the conductive lines formed in the gaps in the third layer of dielectric material 142. The etch process used is preferably highly selective for etching oxides, and does not significantly etch the nitride etch stop layer 138. An example of such process includes using etchants derived from source gasses such as $C_4F_8$/CO or $CF_4$ mixed with $CFH_3$, Ar, or $N_2$. The photo resist mask is stripped by ashing, and the resulting structure, seen in FIG. 19, is ready for the deposition of a conductive material to fill the gaps 148 created in both the second layer of dielectric 134 and the third layer of dielectric material 142, to form vias and conductive lines respectively.

Figure 20:
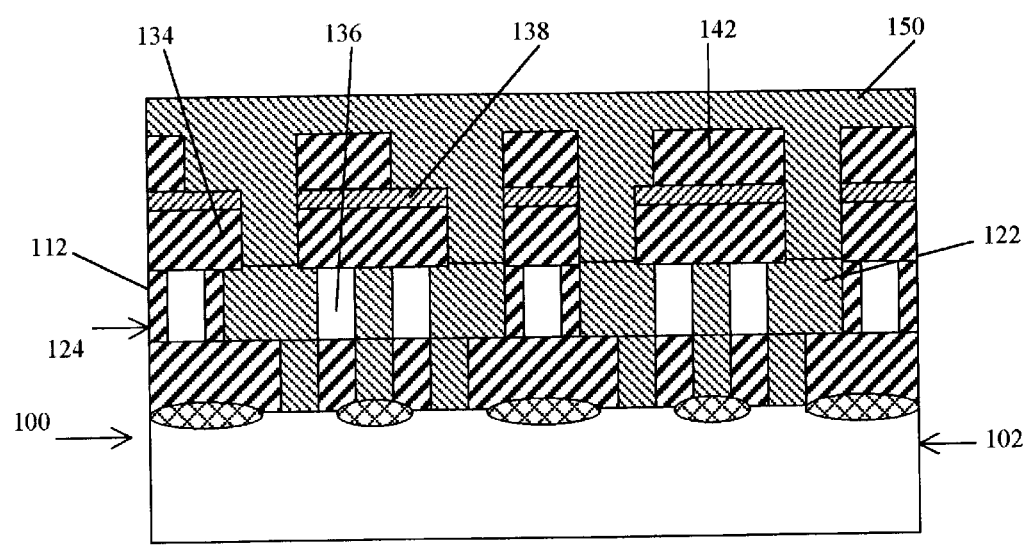

Referring to FIG. 20, a layer of conductive material 150 is deposited on the top of the third layer of dielectric material 142. Any known means for depositing the conductive material 150 may be used including known PVD, CVD, and electrode plating methods. As previously mentioned, it is typical to use a multilayer deposition and wiring structure. For example, it may be desirable to include a thin barrier layer, comprised of such materials as $TiN_x$, $WN_x$, or $TaN_x$, and a thin "glue" or adhesion layer, comprised of such materials as tungsten or titanium, on the inner surfaces of the openings in the dielectric layers to enhance the deposition of subsequent conductive materials and the performance of the device. However, for simplicity, a single layer of conductive material is shown in FIG. 20.

Figure 21:
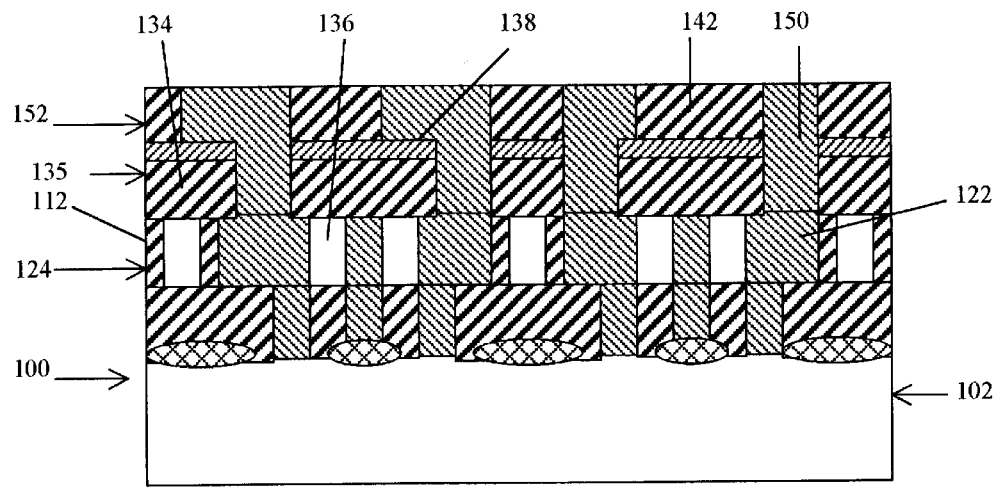

Excess metal remaining above the third layer of dielectric material 142 is next removed. Any desired method for doing so may be used, including current conventional CMP and etch back techniques. CMP is preferred because it results in a planarized surface for deposition of the next dielectric layer. The result of this step is shown in FIG. 21, showing the completed formation of level 2 interconnect layer 152 and the via layer 135.

Figure 22:
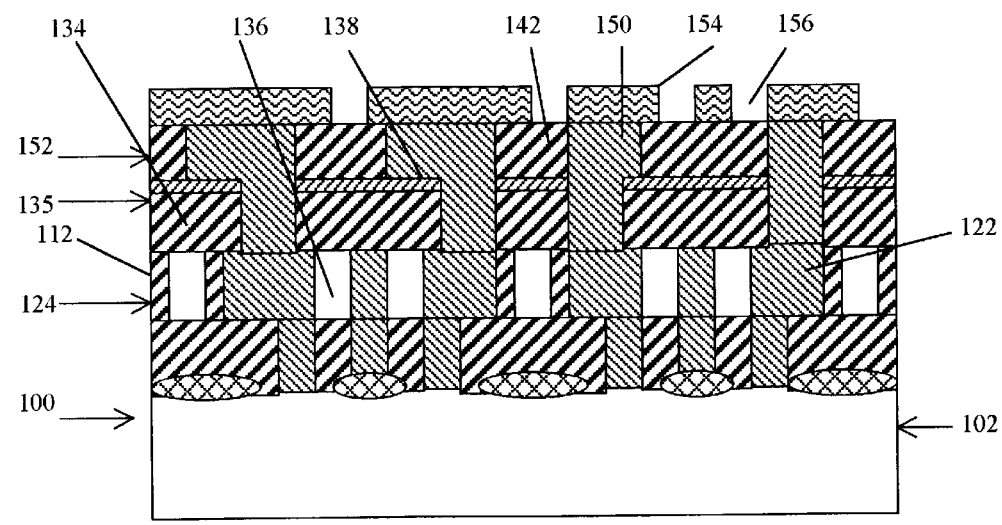

The next several steps comprise the method of the invention for forming gaps or air pockets between conductive elements in an integrated circuit device. Referring to FIG. 22, a layer of photo resist 154 is formed over the level 2 interconnect layer 152. The use of a conventional spin-on method is preferred for forming the photo resist layer 154, however, other methods of applying the photo resist may be acceptable. In order to enhance the photo lithographic process, an ARC may be deposited prior to the photo resist. The photo resist layer 154 is cured in a conventional manner that depends on the particular photo resist material chosen. The photo resist layer 154 is then exposed through a mask to a light source such UV light, electron beam, or X-rays, and the photo resist layer 154 is developed to produce regions where portions of the photo resist layer 154 have been removed to form etch mask gaps 156 to allow etching materials access to the underlying second and third dielectric layers 134 and 142.

Figure 23:
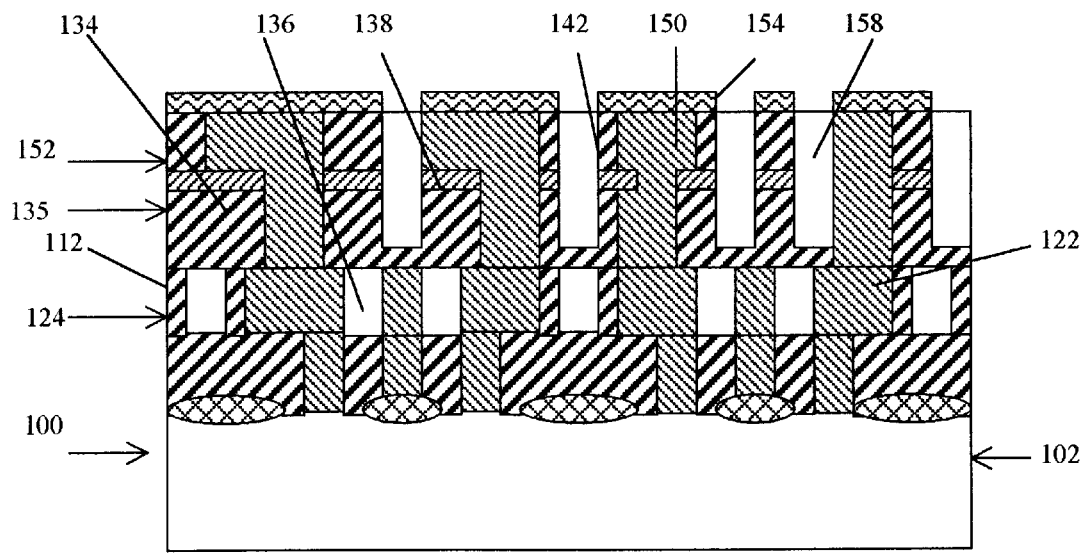

Turning now to FIG. 23, an etching agent is selected to etch both the silicon oxide of the dielectric materials 134 and 142, and the silicon nitride of the etch stop layer 138. Alternatively, the etching processes may alternate between etchants selected to etch silicon oxides, and etchants to etch the silicon nitride. Selected portions of the second dielectric layer 134 and third dielectric layer 142 are etched through the gaps 156 in the photo resist mask layer 152 to create gaps 158 that preferably extend through the level 2 interconnect layer 152, the via layer 135, and the etch stop layer 138. The particular method used to etch the underlying layers through the gaps 156 in the photo resist layer 154 is not critical to the invention, however, conventional RIE or ECR plasma etching is currently preferred, to produce the resulting structure seen in FIG. 23. After etching, the photo resist layer 154 is ashed using a conventional photo resist ashing method to remove any remaining photo resist material.

Figure 24:
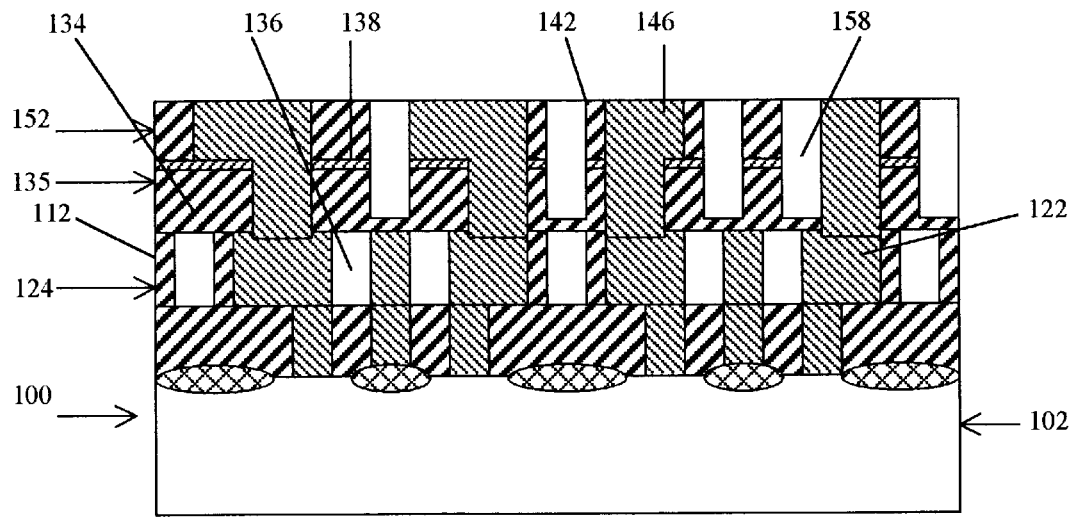
Figure 25:
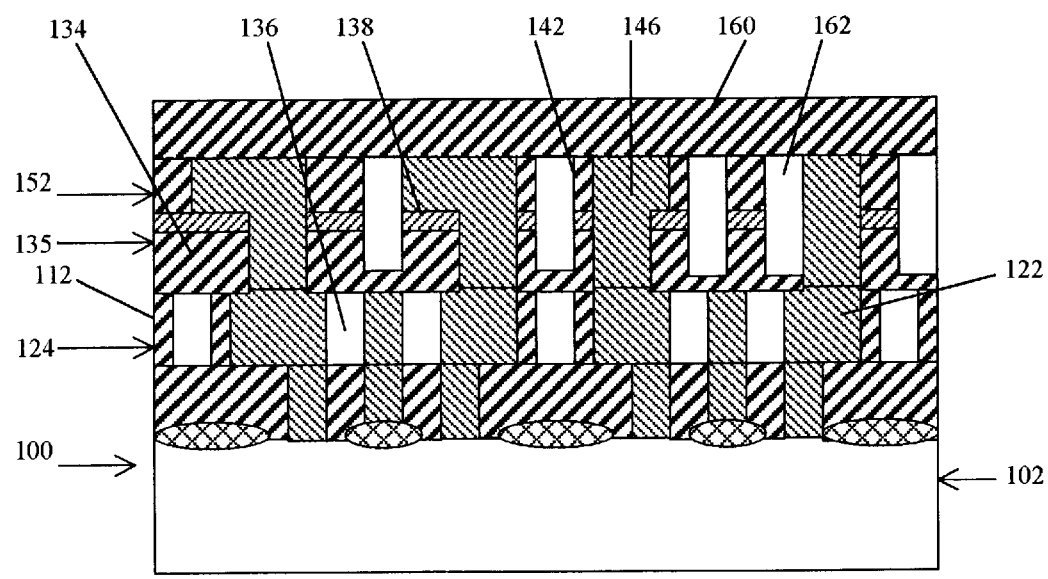

The resulting structure is seen in FIG. 24, showing the photo resist layer 154 removed, and narrow gaps 158 have been formed in the level 2 interconnect layer 152 and the via layer 135 in desired locations. A fourth layer of dielectric material 160 is then deposited over the surface of the level 2 interconnect, and over the gaps 158, creating air pockets, hereafter referenced as air pockets 162, as shown in FIG. 25. It is important that the fourth layer of dielectric material 160 not completely fill the gaps 158.

As previously explained, it has been observed that gaps with a maximum opening less than or equal to 0.5 micron in width, an aspect ratio of height/width larger than or equal to 0.7, and of any length, will not be completely filled by solid dielectric during the method of the invention described above. Thus, it is preferred that the openings of the gaps at the surface of the level 2 interconnect 148 have a width less than or equal to 0.5 micron, and an aspect ratio of height/width larger than or equal to 0.7. However, the method of the invention comprehends that the maximum allowable width of the gaps 158 may be adjusted up or down depending on the particular dielectric material, deposition method and process conditions used.

The steps seen and described in association with FIGS. 15 through 25 may be started at virtually any level or layer of integrated circuit devices, and repeated as necessary to form additional layers of dielectric with conductive material and insulating air pockets.

As apparent from the previous discussion, the method of the present invention provides a means for creating relatively small air pockets, thereby providing the benefit of using air as a low k dielectric material, while avoiding formation of open voids, filling the air pockets with metallic materials in the subsequent processes, weakening the structural integrity of the integrated circuit device, or significantly negatively impacting the heat dissipation properties of the integrated circuit device. Furthermore, the method of the invention can be used in current conventional fabrication processes with existing equipment, damascene and dual damascene processes when copper is incorporated, as well as the fabrication processes when solid low k dielectric material process is mature and incorporated in the integrated circuit industry.

Figure 26:
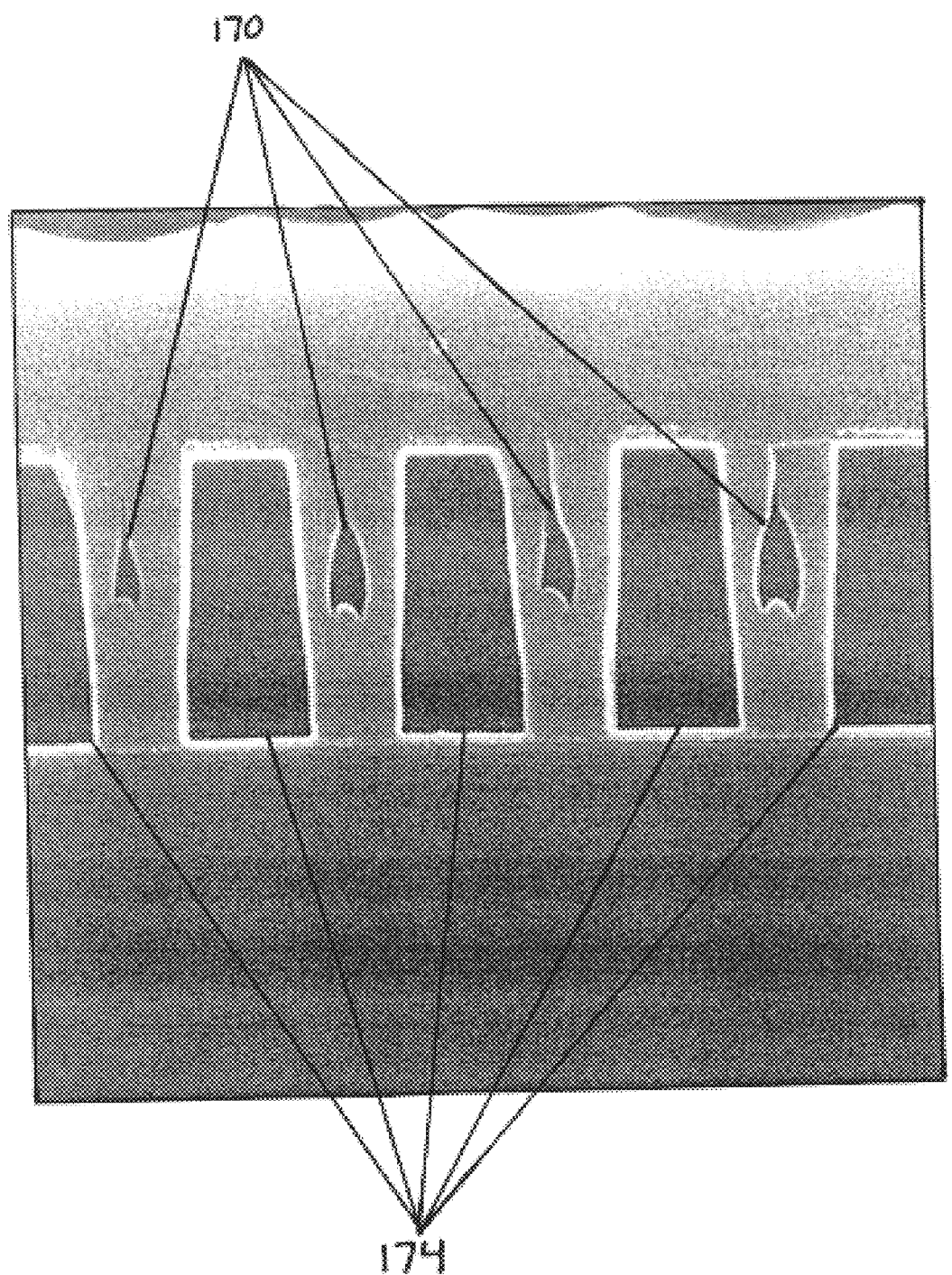
FIG. 26 is a scanning electron microscopy picture of a cross section view of interconnect structures having air pockets.

FIG. 26 is a scanning electron microscopy (SEM) picture of a cross section view of interconnect structure with air pockets 170. (Reference: Shieh etc, "Integration and Reliability Issues for Low Capacitance Air-Gap Interconnect Structures", IITC 98, IEEE, pages 125–129.) As can be seen in FIG. 26, some amount of solid dielectric material 172 is deposited on the bottom and the side walls of the air pockets 170. The air pockets 170 usually extend above the metal structures 174. The extension of the air pockets 170 can be easily controlled by conventional plasma enhanced CVD process for $SiO_2$ deposition.

Figure 27:
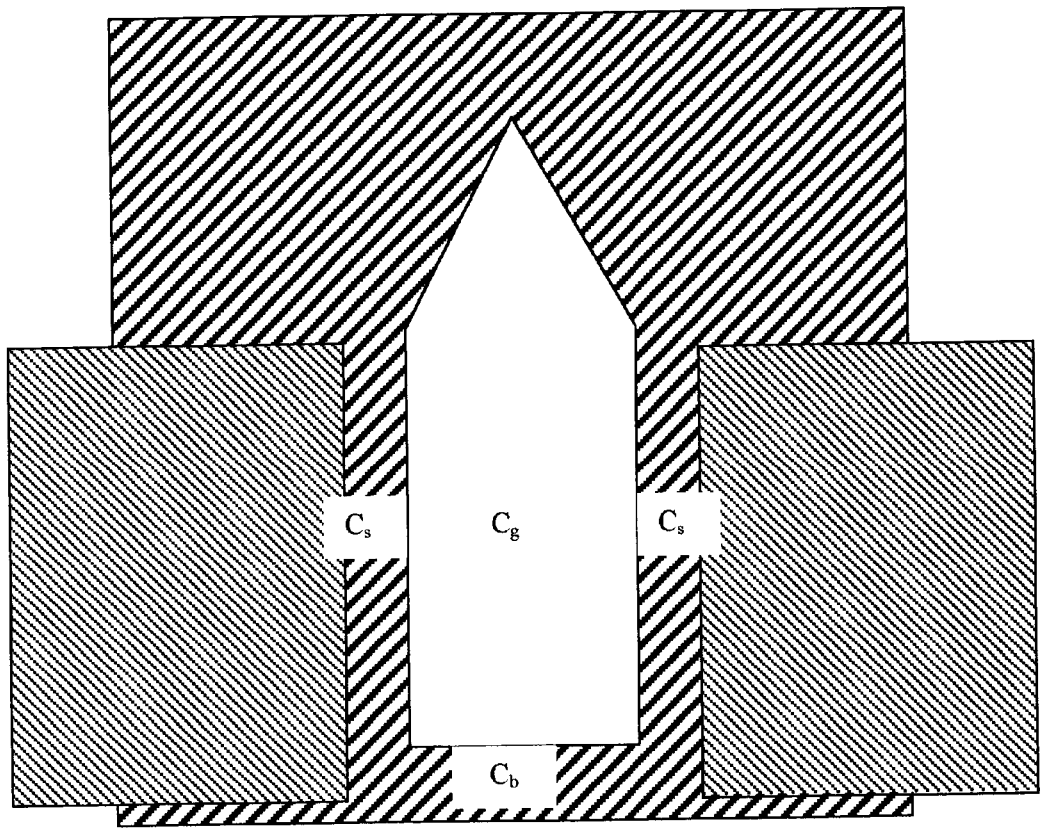
FIG. 27 is schematic representation of the total capacitance ($C_t$) of two conductive structures between which solid dielectric material with a gas pocket is filled.

FIG. 27 is a schematic presentation of a cross section of a typical air pocket formed using the method of the invention. It is noted that some amount of dielectric typically enters the air gaps and coats the sides and bottom of the air gap. The entry of some dielectric material into the gaps is acceptable as long as the gap is not completely filled. Larger gas pockets provide better dielectric isolation. The total capacitance $C_t$ may be expressed as:

$$C_t = C_b + \frac{1}{1/C_s + 1/C_g + 1/C_s}$$

where $C_b$ is the capacitance of the solid dielectric filled at the bottom of the structure, $C_s$ is the capacitance of the solid dielectric that sticks on the wall of the conductive structure, and $C_g$ is the capacitance of the portion of the air pocket between the conductive structure. The total capacitance $C_t$ depends on the dielectric constant of the solid material $k_s$, the height of the structures, the width of the structure, the percent of total height that solid dielectric material fills the bottom of the structure, and the percent of the total width that solid dielectric material deposits on the wall of the structure. For example, with no air gap, the entire isolation between the conductive regions depends only on the solid dielectric used. The effective dielectric constant is 4.3 if the dielectric material is silicon oxide deposited from TEOS precursor. If an air pocket is formed, 20% of the height is filled by oxide on the bottom of the gap, and each side wall is deposited with oxide by 20% of the total width, $$C_t = (4.3)(0.2)(\varepsilon_0 A/d) + (0.8)\frac{1}{\frac{1}{(1)(\varepsilon_0 A/0.6d)} + \frac{1}{(4.3)(\varepsilon_0 A/0.4d)}}$$

$$C_t = 2.014(\varepsilon_0 A/d).$$

As seen in the equation, the effective dielectric constant is 2.014.

The dielectric constant may be possible further reduced when the solid dielectric material used has a lower k value. If the k is 3 for the solid dielectric material, the effective dielectric constant will be 1.69 when the bottom of the structure is filled with solid up to 20% of the height and each side of the wall of the structure is deposited with solid up to 20% of the width.

To those skilled in the art, many changes and modifications will be readily apparent from the consideration of the foregoing description of a preferred embodiment without departure from the spirit of the present invention; the scope thereof being more particularly pointed out by the following claims. For example, it is possible to integrated the process steps of the invention in integrated circuit fabrication processes other than those discussed herein. The description herein and the disclosures hereof are by way of illustration only and should not be construed as limiting the scope of the present invention which is more particularly pointed out by the following claims.

What is claimed is:

1. A method of making an integrated circuit device structure having gas pockets used to provide dielectric isolation between selected conductive structures, the method comprising:

(a) providing an integrated circuit device structure comprising a plurality of layers and an upper surface;

(b) forming a mask over the upper surface;

(c) forming openings in the mask corresponding to positions where gas pockets are desired;

(e) etching through the openings in the mask to form gaps in at least one layer, the gaps being open at the upper surface, each gap having a width, a depth and a length;

(f) depositing a layer of dielectric material over the upper surface and the openings of the gaps formed therein;

whereby gas pockets are created in desired locations.

2. The method of claim 1, wherein at least one layer of the plurality of layers comprises regions formed of at least one conductive material and regions formed of at least one solid dielectric material.

3. The method of claim 2, wherein the at least one layer is an interconnect layer.

4. The method of claim 2, wherein the at least one layer is a conductive line layer.

5. The method of claim 2, wherein the gaps are formed substantially within the regions formed of at least one dielectric material.

6. The method of claim 2, wherein the gaps are formed substantially within the regions formed of at least one conductive material.

7. The method of claim 1, wherein the openings of the gaps in the upper surface are sized to prevent the gaps from filling completely with dielectric material during step (e).

8. The method of claim 7, wherein the width of the openings of the gaps are approximately 0.5 microns wide.

9. The method of claim 7, wherein the width of the openings of the gaps in the upper surface is less than or equal to 0.5 microns wide.

10. The method of claim 8, wherein the aspect ratio of the height to width of the of the gaps are at least 0.7.

11. The method of claim 7 wherein the openings in the upper surface of each gap may be of any desired length.

12. The method of claim 1, wherein each gap has a depth extending through at least one layer of the plurality of layers.

13. The method of claim 1, wherein each gap has a depth extending through at least two layers of the plurality of layers.

* * * * *